US010622457B2

United States Patent
Cai et al.

(10) Patent No.: US 10,622,457 B2
(45) Date of Patent: Apr. 14, 2020

(54) FORMING REPLACEMENT LOW-K SPACER IN TIGHT PITCH FIN FIELD EFFECT TRANSISTORS

(71) Applicants: INTERNATIONAL BUSINESS MACHINES CORPORATION, Armonk, NY (US); GLOBALFOUNDRIES INC., Grand Cayman (KY); STMicroelectronics, Inc., Coppell, TX (US)

(72) Inventors: Xiuyu Cai, Niskayuna, NY (US); Chun-Chen Yeh, Clifton Park, NY (US); Qing Liu, Irvine, CA (US); Ruilong Xie, Niskayuna, NY (US)

(73) Assignees: INTERNATIONAL BUSINESS MACHINES CORPORATION, Armonk, NY (US); GLOBAL FOUNDRIES INC., Grand Cayman (KY); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/879,968

(22) Filed: Oct. 9, 2015

(65) Prior Publication Data
US 2017/0104082 A1    Apr. 13, 2017

(51) Int. Cl.
*H01L 21/768*    (2006.01)
*H01L 29/78*    (2006.01)
(Continued)

(52) U.S. Cl.
CPC .... *H01L 29/6656* (2013.01); *H01L 21/76829* (2013.01); *H01L 21/76897* (2013.01);
(Continued)

(58) Field of Classification Search
CPC .......... H01L 29/6656; H01L 29/66545; H01L 29/6653; H01L 29/4232; H01L 21/823431;
(Continued)

(56) References Cited

U.S. PATENT DOCUMENTS 8,450,178 B2    5/2013  Cheng et al.
8,524,592 B1    9/2013  Xie et al.
(Continued)

OTHER PUBLICATIONS

Ko et al., "A novel CVD-SiBCN low-K spacer technology for high-speed applications" Symposium on VLSI Technology Digest of Technical Papers, Jun. 2008, pp. 108-109.
(Continued)

*Primary Examiner* — Yu Chen
(74) *Attorney, Agent, or Firm* — Tutunjian & Bitetto, P.C.; Vazken Alexanian (57) ABSTRACT

A semiconductor device that a fin structure, and a gate structure present on a channel region of the fin structure. A composite spacer is present on a sidewall of the gate structure including an upper portion having a first dielectric constant, a lower portion having a second dielectric constant that is less than the first dielectric constant, and an etch barrier layer between sidewalls of the first and second portion of the composite spacer and the gate structure. The etch barrier layer may include an alloy including at least one of silicon, boron and carbon.

12 Claims, 8 Drawing Sheets

(51) Int. Cl.
*H01L 29/66* (2006.01)
*H01L 29/417* (2006.01)
*H01L 29/06* (2006.01)
*H01L 29/08* (2006.01)
*H01L 29/161* (2006.01)
*H01L 29/165* (2006.01)

(52) U.S. Cl.
CPC ...... *H01L 29/0653* (2013.01); *H01L 29/0847* (2013.01); *H01L 29/161* (2013.01); *H01L 29/165* (2013.01); *H01L 29/41775* (2013.01); *H01L 29/41791* (2013.01); *H01L 29/6653* (2013.01); *H01L 29/66515* (2013.01); *H01L 29/66545* (2013.01); *H01L 29/66795* (2013.01); *H01L 29/785* (2013.01); *H01L 29/7848* (2013.01); *H01L 29/7851* (2013.01)

(58) Field of Classification Search
CPC ........... H01L 21/823821; H01L 21/845; H01L 21/823418; H01L 21/823814; H01L 21/823468; H01L 21/823864; H01L 29/66636; H01L 29/1037; H01L 29/66795–66818; H01L 29/785–7856; H01L 27/0886; H01L 27/0924; H01L 27/1211; H01L 21/76897; H01L 29/41783; H01L 29/41775; H01L 29/41791; H01L 29/0649–0653; H01L 29/0847; H01L 29/0865; H01L 29/0882; H01L 29/7848; H01L 29/66515; H01L 2029/7857; H01L 2029/7858; H01L 21/76829–21/76834
See application file for complete search history.

(56) References Cited

U.S. PATENT DOCUMENTS

| | | | |
|---|---|---|---|
| 2006/0003533 A1* | 1/2006 | Kammler | H01L 21/26506 438/300 |
| 2007/0034906 A1* | 2/2007 | Wang | H01L 21/823807 257/224 |
| 2008/0029834 A1* | 2/2008 | Sell | H01L 29/4983 257/411 |
| 2011/0068431 A1 | 3/2011 | Knorr et al. | |
| 2011/0210447 A1* | 9/2011 | Seidel | H01L 21/76808 257/774 |
| 2012/0119307 A1 | 5/2012 | Li et al. | |
| 2013/0092984 A1 | 4/2013 | Liu et al. | |
| 2013/0095629 A1 | 4/2013 | Ando et al. | |
| 2013/0187229 A1 | 7/2013 | Cheng et al. | |
| 2013/0252430 A1 | 9/2013 | Ranjan et al. | |
| 2013/0270655 A1 | 10/2013 | Adam et al. | |
| 2013/0277686 A1* | 10/2013 | Liu | H01L 29/6653 257/77 |
| 2013/0307087 A1 | 11/2013 | Xie et al. | |
| 2014/0024192 A1 | 1/2014 | Kim et al. | |
| 2014/0124841 A1 | 5/2014 | Xie et al. | |
| 2014/0295637 A1 | 10/2014 | Mehta et al. | |
| 2015/0126012 A1* | 5/2015 | Jeong | H01L 29/66628 438/300 |
| 2015/0162332 A1 | 6/2015 | Kim et al. | |
| 2015/0221749 A1* | 8/2015 | Xie | H01L 29/66545 257/410 |
| 2015/0333136 A1* | 11/2015 | Xie | H01L 29/66545 257/384 |
| 2015/0364578 A1* | 12/2015 | Liu | H01L 29/66795 257/401 |
| 2015/0380514 A1* | 12/2015 | Bentley | H01L 29/6656 257/346 |
| 2016/0141381 A1 | 5/2016 | Kim et al. | |
| 2016/0141417 A1* | 5/2016 | Park | H01L 29/66545 257/365 |
| 2016/0225667 A1* | 8/2016 | Zang | H01L 29/4991 |
| 2016/0284817 A1 | 9/2016 | Basker et al. | |
| 2016/0351677 A1 | 12/2016 | Bao et al. | |

OTHER PUBLICATIONS

U.S. Office Action issued in U.S. Appl. No. 15/222,261, dated Nov. 1, 2017, pp. 1-28.
U.S. Office Action issued in U.S. Appl. No. 15/222,261, dated Mar. 15, 2018, pp. 1-18.
U.S. Notice of Allowance issued in U.S. Appl. No. 15/222,261, dated Nov. 6, 2019, pp. 1-13.

* cited by examiner

FORMING REPLACEMENT LOW-K SPACER IN TIGHT PITCH FIN FIELD EFFECT TRANSISTORS

BACKGROUND

Technical Field

The present disclosure relates to semiconductor devices, and more particularly to semiconductor devices including fin structures and dielectric spacers.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one embodiment, a method of forming a semiconductor device that includes forming an epitaxial semiconductor material on portions of a fin structure on opposing sides of a first gate structure, the replacement gate structure including a replacement sidewall spacer. The replacement sidewall spacer is removed to providing a spacer opening between the epitaxial semiconductor material and a replacement gate conductor structure of the replacement gate structure. A conformal etch barrier layer is formed on exposed sidewalls of the epitaxial semiconductor material and the replacement gate conductor structure. A composite spacer is formed in the spacer opening including a first portion having a first dielectric constant on the fin structure and a second portion of a second dielectric contact on the first portion of the composite spacer, the first dielectric constant being less than the second dielectric constant. The replacement gate conductor structure is then removed with an etch to provide a gate conductor opening, wherein the conformal etch barrier layer protects the composite spacer during the etch process. A functional gate conductor is formed in the gate conductor opening.

In another embodiment, a method of forming a semiconductor device that includes forming an epitaxial semiconductor material on portions of a fin structure on opposing sides of a first gate structure, the replacement gate structure including a replacement sidewall spacer. The replacement sidewall spacer is removed to providing a spacer opening between the epitaxial semiconductor material and a replacement gate conductor structure of the replacement gate structure. A composite spacer is formed in the spacer opening including a first portion having a first dielectric constant on the fin structure and a second portion of a second dielectric contact on the first portion of the composite spacer, the first dielectric constant being less than the second dielectric constant. The replacement gate conductor structure is then removed with an etch to provide a gate conductor opening. A functional gate conductor is formed in the gate conductor opening. Contacts are formed to source and drain regions to the semiconductor device, wherein the second portion of the composite spacer protects the first portion of the composite spacer during via opening etch.

In another aspect of the present disclosure, a semiconductor device is provided that includes a fin structure, and a gate structure present on a channel region of the fin structure. A composite spacer is present on a sidewall of the gate structure including an upper portion having a first dielectric constant, a lower portion having a second dielectric constant that is less than the first dielectric contacts, and an etch barrier layer between sidewalls of the first and second portion of the composite spacer and the gate structure, the etch barrier layer comprising an alloy including at least one of silicon, boron and carbon.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a low-k spacer for use in semiconductor devices, such as Fin Field Effect Transistors (FinFETs). A field effect transistor (FET) is a semiconductor device in which output current, i.e., source-drain current, is controlled by the voltage applied to a gate structure to the channel of a semiconductor device. As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The source and drain regions of a finFET are typically formed on source and drain portions of the fin structures that are on opposing sides of the portion of the fin structure containing the channel region. The term "low-k" denotes a dielectric material having a dielectric constant at room temperature (e.g., 20° C. to 25° C.) that is less than the dielectric constant of silicon oxide ($SiO_2$). For example, a low-k dielectric constant material may have a dielectric constant that is less than 4.0, e.g., a dielectric constant of 3.9 or less.

As FinFET scaling continues to the 7 nm realm, a low-k spacer is required, and typically a dielectric constant lower than 3.9 may be preferred. The dielectric selected for the spacer to meet these scaling and dielectric constant requirements can not suffer from self-aligned contact (SAC) etch corner loss, lateral loss during the various pre-clean processes used in semiconductor manufacturing, such as high-k pre-clean, epi pre-clean, silicide pre-clean and contact pre-clean. Additionally, forming replacement spacers after contact etch may not be preferred, because the etch and re-deposition process could damage the gate stack. Further difficulties may be encountered in the event that the contacts for the source and drain regions overlap the dielectric cap present on an upper surface of the gate structure. In view of the above, a composite spacer is provided that includes a low-k first portion, i.e., lower portion, and a high-k second portion, i.e., upper portion, in which the composite spacer also includes an etch barrier for protecting the spacer during removal of the replacement gate structure. Further details regarding the method and structures of the present disclosure are now described with reference to FIGS. 1-7.

Figure 1A:
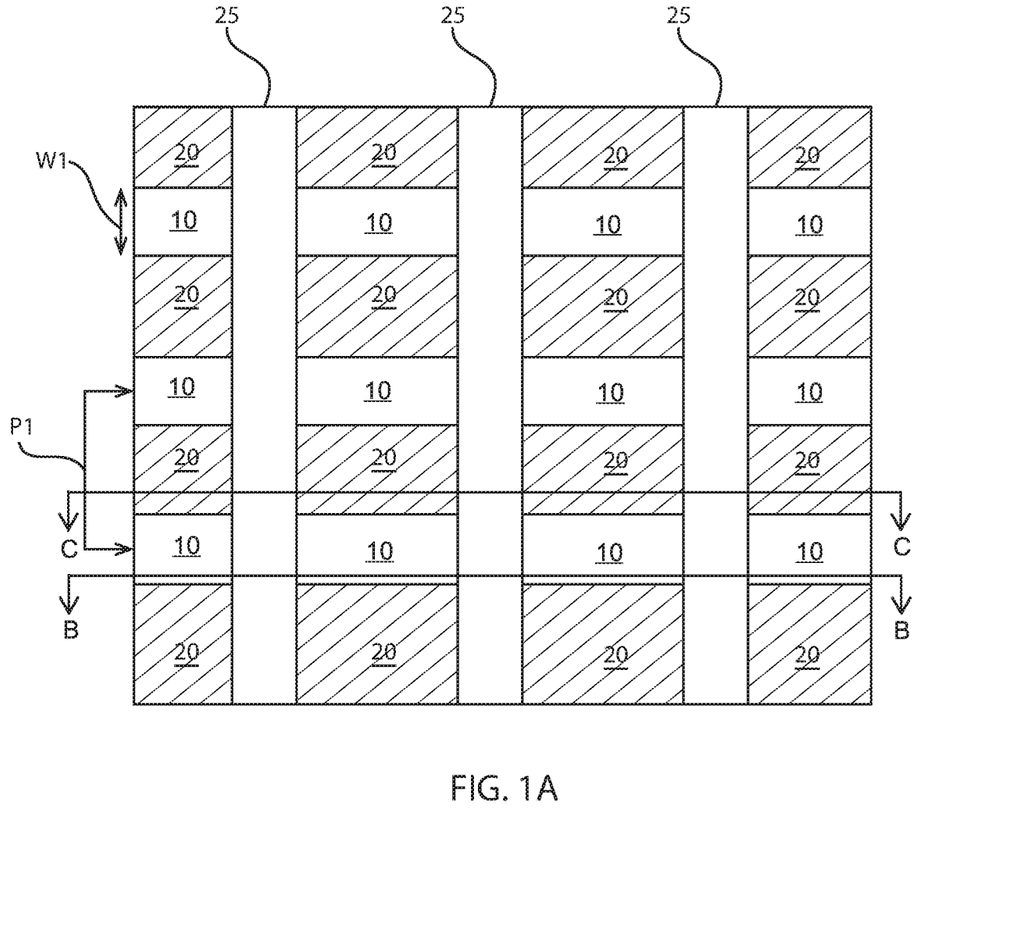
FIG. 1A is a top down structure depicting a replacement gate structure on a plurality of fin structures, in accordance with one embodiment of the present disclosure.
Figure 1B:
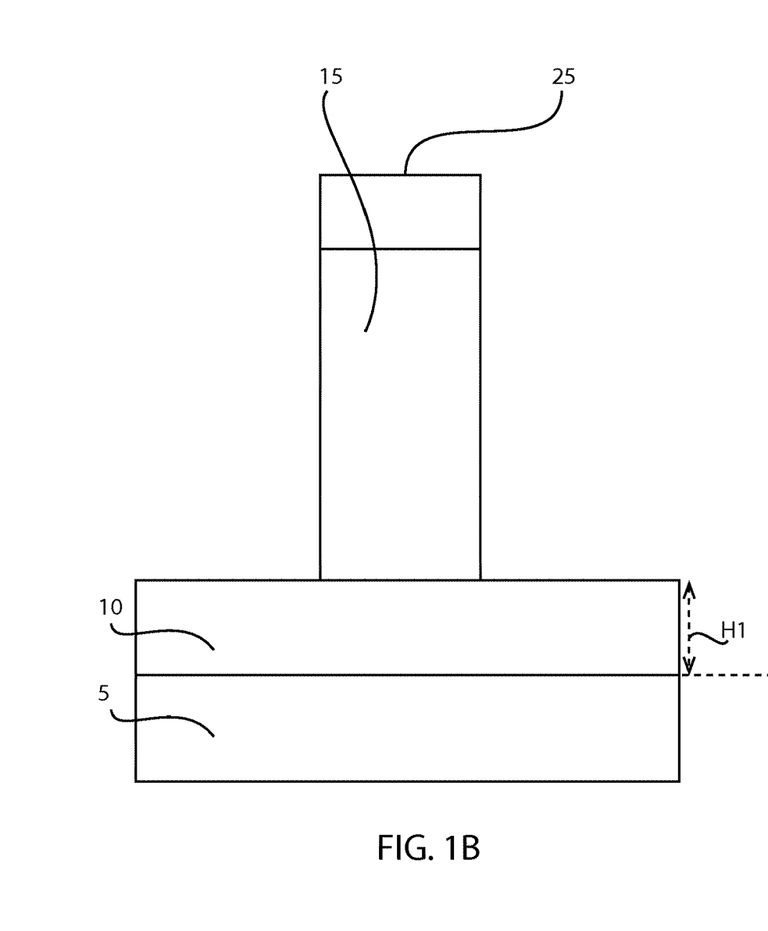
FIG. 1B is a side cross-sectional view along section line B-B (the section line through the fin structure) of FIG. 1A.
Figure 1C:
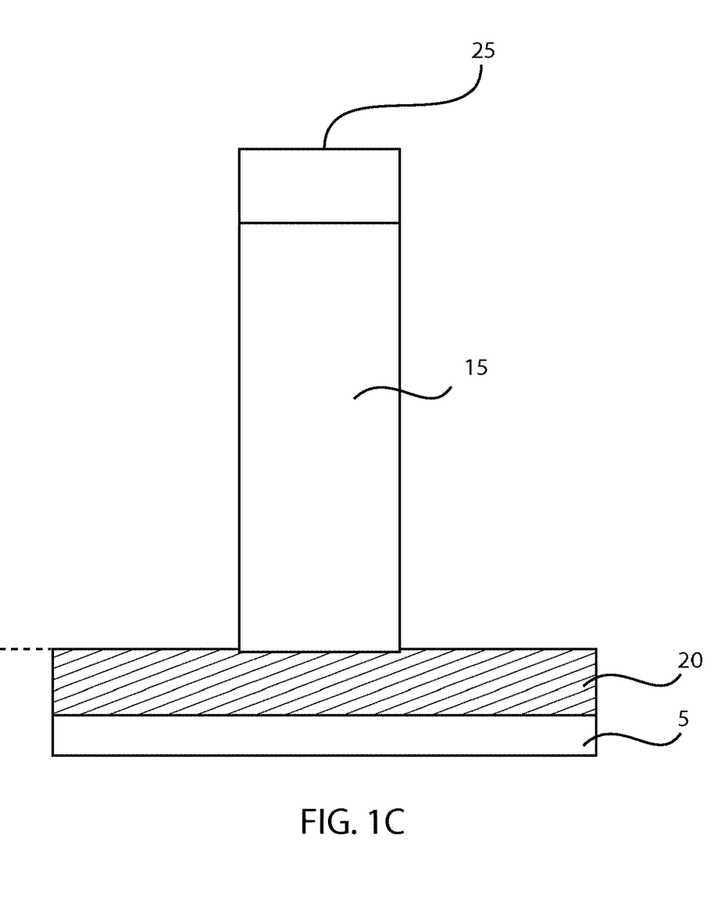
FIG. 1C is a side cross-sectional view along section line C-C (the section line between adjacent fin structures) of FIG. 1A.

FIGS. 1A-1C depict one embodiment of a replacement gate conductor 15 on a plurality of fin structures 10. The term "replacement" as used to describe the replacement gate conductor denotes that the structure is present during the process sequence, but is not present in the final device structure, in which the replacement structure provides an opening that dictates the size and geometry of a later formed functional gate conductor.

The semiconductor material that provides the fin structures 10 may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The plurality of fin structures 10 may be formed from a semiconductor on insulator (SOI) substrate, or a bulk semiconductor substrate, using deposition photolithography and etch processes.

In the embodiment depicted in FIGS. 1A-1C, the fin structures 10 are formed from a bulk semiconductor substrate, in which isolation, i.e., isolation regions 20, between adjacent fins structures 10 can be provided by a deposited dielectric material. Examples of dielectric material suitable for the isolation regions 20 include oxides, e.g., silicon oxide, or nitrides, e.g., silicon nitride, or a combination thereof.

In some embodiments, in which the fin structures 10 are formed from an SOI substrate, the fin structures 10 are formed from the SOI layer, i.e., the semiconductor layer that is present on the buried oxide (BOX) layer. In this example, the BOX layer provides for isolation between adjacent fin structures, and the base semiconductor substrate, i.e., the semiconductor layer on the opposite face of the BOX layer as the SOI layer, provides mechanical support.

In one embodiment, the patterning process used to define each of the fin structures 10 is a sidewall image transfer (SIT) process. The SIT process can include forming a mandrel material layer (not shown) on the material layer that provides the fin structures 10, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 10, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 10, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 10. Following etching, i.e., pattern transfer, the SIT process may conclude with removing the dielectric spacers using an etch process or a planarization process.

It is noted that the aforementioned spacer image transfer (SIT) process is only one method of forming the fin structures 10. In another embodiment, each of the fin structures 10 may be formed using a photoresist etch mask. Specifically, in one example, a photoresist mask is formed overlying the semiconductor composition layer which provides the fin structures 10. The exposed portions of the semiconductor layer that provides the fin structures 10 that are not protected by the photoresist mask are removed using a selective etch process. To provide the photoresist mask, a photoresist layer is first positioned on the semiconductor layer that provides the fin structure 10, e.g., SOI layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 10. The etch process may be an anisotropic process, such as reactive ion etch (RIE).

Each of the fin structures 10 may have a height $H_1$ ranging from 5 nm to 200 nm. In another embodiment, each of the fin structures 10 has a height $H_1$ ranging from 10 nm to 100 nm. In one example, each of the fin structures 10 has a height $H_1$ ranging from 20 nm to 50 nm. Each of the plurality of fin structures 10 may have a width $W_1$ of less than 20 nm. In another embodiment, each of the fin structures 10 has a width $W_1$ ranging from 3 nm to 8 nm. It is noted that any number of fin structures 10 may be formed from the substrate. The pitch P1 separating adjacent fin structures 10 may range from 35 nm to 45 nm. In another example, the pitch P1 separating adjacent fin structures 10 may range from 30 nm to 40 nm.

Following the formation of the fin structures 10, the isolation regions 20 may be formed between adjacent fin structures 10 using a deposition process, such as chemical vapor deposition, e.g., plasma enhanced chemical vapor deposition (PECVD) or metal organic chemical vapor deposition (MOCVD).

FIGS. 1A-1C further depict forming the replacement gate conductor 15 on the channel portion of the fin structures 10. As will be described in greater detail below, the replacement gate conductor 15 is typically substituted with a functional gate conductor of a functional gate structure later in the process sequence that is disclosed herein. The "gate structure" functions to switch the semiconductor device from an "on" to "off" state, and vice versa. In some embodiments, the replacement gate conductor 15 may be formed of any material that can be removed selectively to the underlying fin structure, and the later formed etch barrier layer. In some examples, the replacement gate conductor 15 may be composed of a semiconductor material, such as silicon (Si) or polysilicon. In other examples, the replacement gate conductor 15 may be composed of a dielectric, such as silicon oxide or silicon nitride. The replacement gate conductor 15 may also be composed of a metal, such as Al, W, Cu, and Ti or other like conductive metals.

The replacement gate conductor 15 may be formed by using a deposition method, such as a chemical vapor deposition method and/or a physical vapor deposition (PVD), to deposit the material layers for the at least one gate dielectric layer and the at least one gate electrode followed by photolithography and etch processing. In some embodiments, a hardmask 25 may be formed on the upper surface of the material layer for the replacement gate conductor 15 as part of the photolithography and etch processing used to define the geometry of the replacement gate conductor 15. The hardmask 25 may be composed of a nitride, oxide, or oxynitride material.

Figure 2A:
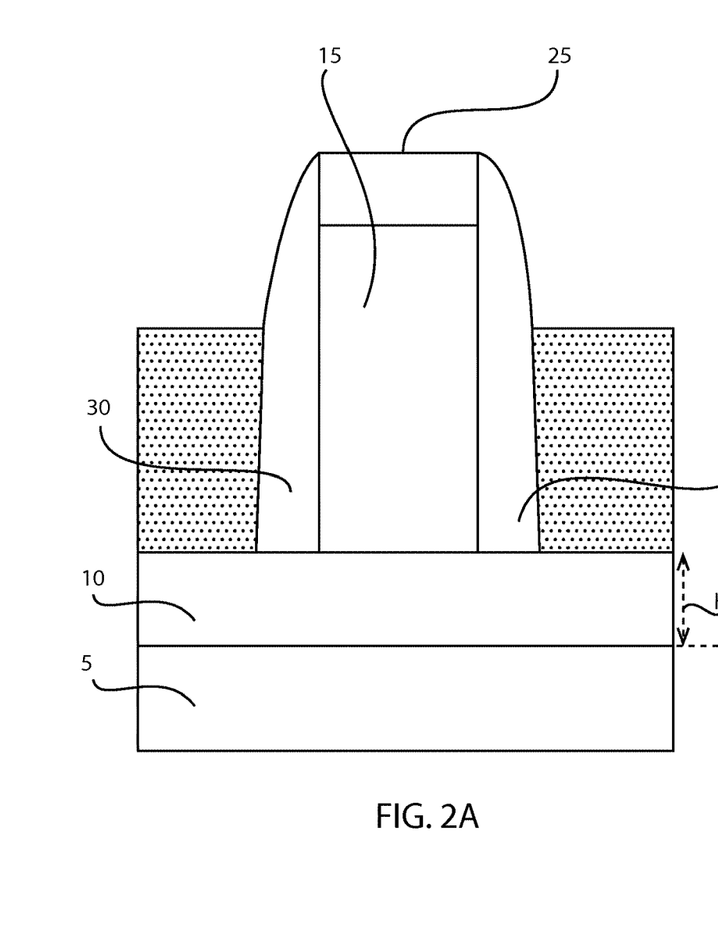
FIG. 2A is a side cross-sectional view along the section line through the fin structure depicting one embodiment of the formation of a replacement spacer and the formation of epitaxial semiconductor material on the plurality of fins depicted in FIG. 1A.
Figure 2B:
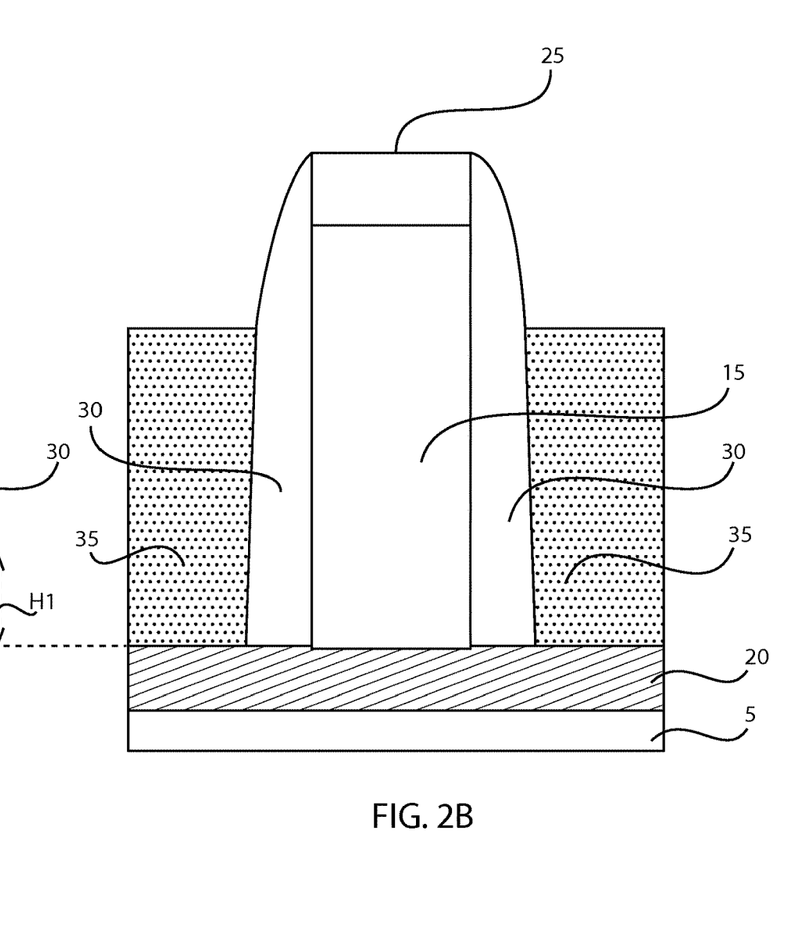
FIG. 2B is a side cross-sectional view along the section line between adjacent fin structures of the structure depicted in FIG. 2A.

FIGS. 2A and 2B one embodiment of the formation of a replacement spacer 30 and the formation of epitaxial semiconductor material 35 on the plurality of fin structures 10. The term "replacement" as used to describe the replacement spacer 30 denotes that the structure is present during the process sequence, but is not present in the final device structure, in which the replacement structure provides an opening that dictates the size and geometry of a later formed composite spacer. The replacement spacer 30 may be composed of any material that can be removed, e.g., etched, selectively to the fin structure 10, the epitaxial semiconductor material 35, and at least one of the hard mask 25 and the replacement gate conductor 15. In some embodiments, the replacement spacer 30 may be of a dielectric material, such as a nitride. For example, the replacement spacer 30 can be composed of silicon nitride. In other examples, the replacement spacer 30 can be composed of silicon oxide, boron nitride, silicon carbon or any suitable combination of those materials. In some embodiments, the replacement spacer 30 can be formed by a conformal deposition of a dielectric material layer on sidewalls of the replacement gate conductor 15, the upper surface of the hard mask 25, and the upper surface of the fin structures 10 and isolation regions 25. The deposition process used for forming the dielectric material layer for the replacement spacer 30 may be chemical vapor deposition (CVD), such as plasma enhanced chemical vapor deposition (PECVD) or metal organic chemical vapor deposition (MOCVD). An anisotropic etch, e.g., reactive ion etch (RIE), may then remove the portions of the dielectric material for the replacement spacer 30 that is present on the hard mask 25, the fin structure 10. The remaining portion of the dielectric material that is present on the sidewalls of the replacement gate conductor 15 provides the replacement spacer 30.

In some embodiments, following the formation of the replacement spacer 30, the epitaxial semiconductor material 35 is formed on the plurality of fin structures 10. The epitaxial semiconductor material 35 may provide a portion of the source region and drain region of the semiconductor devices, and may therefore be n-type or p-type doped.

The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

In some embodiments, the epitaxial semiconductor material 35 may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs). For example, when the semiconductor device, e.g., FinFETs, being formed are p-type and the fin structures 10, 10 are composed of silicon (Si), the source and drain regions may be doped to a p-type conductivity, and the material of the epitaxial semiconductor material 30 may be a germanium containing material, such as silicon germanium (SiGe). In other examples, when the semiconductor device, e.g., FinFETs, being formed are n-type and the fin structures 10 are composed of silicon (Si), the source and drain regions may be doped to an n-type conductivity, the material of the epitaxial semiconductor material 35 may be silicon (Si) or silicon doped with carbon (Si:C).

In one embodiment, a number of different sources may be used for the epitaxial deposition of the epitaxial semiconductor material 35. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an epitaxial semiconductor material 35 of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition may result in crystal defects and film cracking. In one embodiment, the thickness of epitaxial semiconductor material 35 may range from 10 nm to 100 nm. In another embodiment, the thickness of epitaxial semiconductor material 35 may range from 40 nm to 60 nm.

The epitaxial semiconductor material 35 may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

In the embodiments in which the finFET device being formed has n-type source and drain regions, and is referred to as an n-type finFET, the doped epitaxial semiconductor material 35 is doped with an n-type dopant to have an n-type conductivity. In the embodiments in which the finFET device being formed has p-type source and drain regions, and is referred to as a p-type finFET, the doped epitaxial semiconductor material 35 is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In one embodiment, the n-type gas dopant source may include arsine (AsH$_3$), phosphine (PH$_3$) and alkylphosphines, such as with the empirical formula R$_x$PH$_{(3-x)}$, where R=methyl, ethyl, propyl or butyl and x=1, 2 or 3. Alkylphosphines include trimethylphosphine ((CH$_3$)$_3$P), dimethylphosphine ((CH$_3$)$_2$PH), triethylphosphine ((CH$_3$CH$_2$)$_3$P) and diethylphosphine ((CH$_3$CH$_2$)$_2$PH). The p-type gas dopant source may include diborane (B$_2$H$_6$).

In some embodiments, the n-type or p-type dopant may be present in the doped epitaxial semiconductor material 35 in a concentration ranging from $1\times10^{17}$ to $1\times10^{21}$ atoms/cm$^3$. In another embodiment, the n-type or p-type dopant may be present in the doped epitaxial semiconductor material 35 in a concentration ranging from $1\times10^{18}$ to $1\times10^{20}$ atoms/cm$^3$.

In one embodiment, dopant from the doped epitaxial semiconductor material 35 is diffused into the fin structures 5 to form extension dopant regions. In some embodiments, the diffusion, i.e., driving, of the dopant from the doped epitaxial semiconductor material 35 into the extension region portions of the fin structures 10 comprises thermal annealing. In one embodiment, the thermal annealing that diffuses the dopant from the doped epitaxial semiconductor material 35 into the extension region portions of the fin structures 10 includes an annealing process selected from the group consisting of rapid thermal annealing (RTA), flash lamp annealing, furnace annealing, laser annealing and combinations thereof.

Figure 3A:
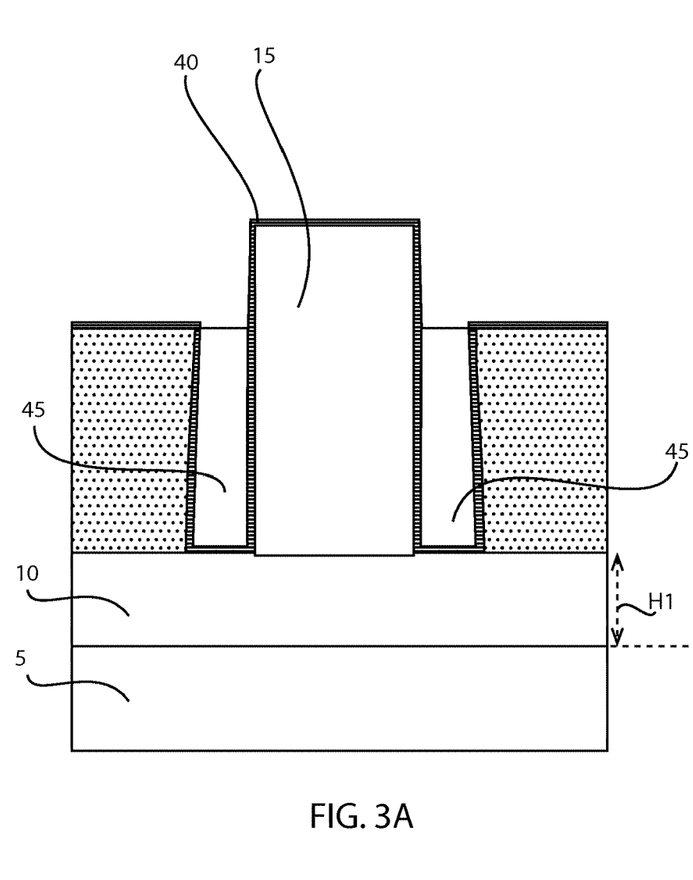
FIG. 3A is a side cross-sectional view along the section line through the fin structure depicting removing the replacement spacer, and forming an etch barrier along the sidewalls of the gate structure and the sidewalls of the epitaxial semiconductor material.
Figure 3B:
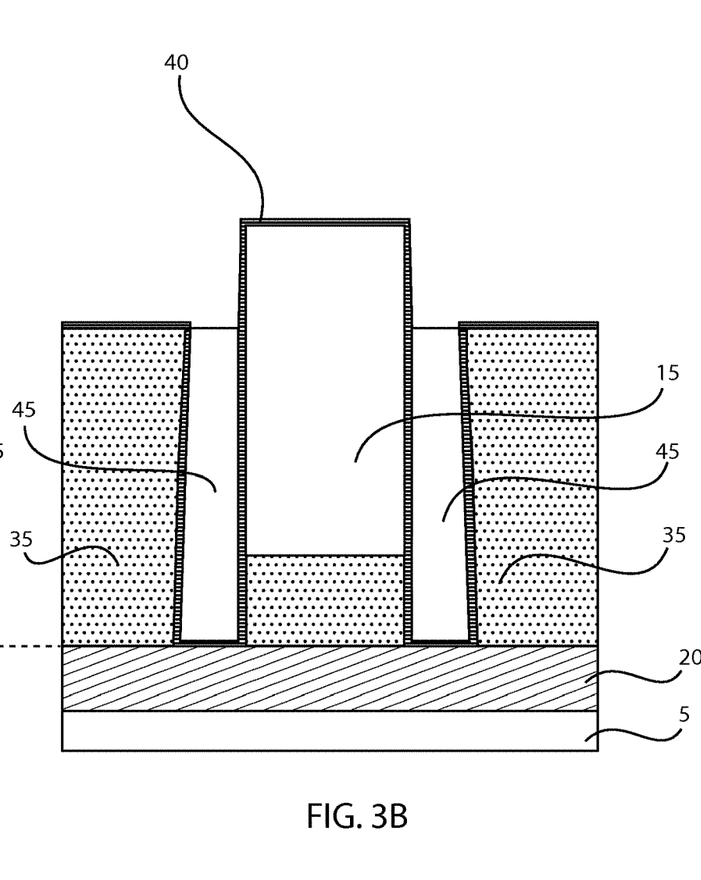
FIG. 3B is a side cross-sectional view along the section line between adjacent fin structures of the structure depicted in FIG. 3A.

FIGS. 3A and 3B depict removing the replacement spacer 30, and forming a etch barrier layer 40 along the sidewalls of the replacement gate conductor 15 and the sidewalls of the epitaxial semiconductor material 35. The replacement spacer 30 may be removed by a process that removes the material of the replacement spacer 30 selectively to at least one of replacement gate conductor 15, the fin structure 10, and the epitaxial semiconductor material 35. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. In some embodiments, the replacement spacer 30 may be removed by a dry process, such as reactive ion etch, or a wet chemical etch. Removing the replacement spacer 30 produces a spacer opening.

In some embodiments, the etch process that removes the replacement spacer 30 also removes the hard mask 25, as depicted in FIGS. 3A and 3B.

The etch barrier layer 40 may be deposited in the spacer opening created by removing the replacement spacer 30. The etch barrier 40 may be a conformally deposited material layer. The term "conformal" denotes a layer having a thickness that does not deviate from greater than or less than 30% of an average value for the thickness of the layer. In some embodiments, the etch barrier layer 40 may be a conformally deposited material layer that composed of any dielectric material, such as an oxide containing dielectric, e.g., silicon oxide (SiO$_2$); a nitrogen containing dielectric, e.g., silicon nitride; or a combination thereof, such as silicon oxynitride, so long as the material selected for the etch barrier layer 40 allows for the replacement gate conductor 15 to be removed without damaging the subsequently formed composite spacer.

The etch barrier layer 40 may be blanket deposited so that a portion of the etch barrier layer 40 is formed on the upper surfaces of the epitaxial semiconductor material 35, sidewall surfaces of the epitaxial semiconductor material 35, the upper surfaces of the replacement gate conductor 17, the sidewall surfaces of the replacement gate conductor 17, the upper surface of the replacement gate structure, as well as the exposed upper surfaces of the fin structure 10 and the isolation regions 20, as depicted in FIGS. 3A and 3B.

The etch barrier layer 40 can be deposited using chemical vapor deposition (CVD). Examples of chemical vapor deposition processes for forming the etch barrier layer 40 include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

In some embodiments, the etch barrier layer 40 is composed of an alloy of silicon (Si), boron (B), and carbon (C). The etch barrier layer 45 can also be composed of silicon carbon boron nitride (SiCBN) or silicon oxycarbonitride (SiOCN). In some embodiments, the etch barrier layer 40 is deposited to a thickness ranging from 1 nm to 15 nm. In another embodiment, the etch barrier layer 45 may have a thickness ranging from 2 nm to 5 nm.

Figure 4A:
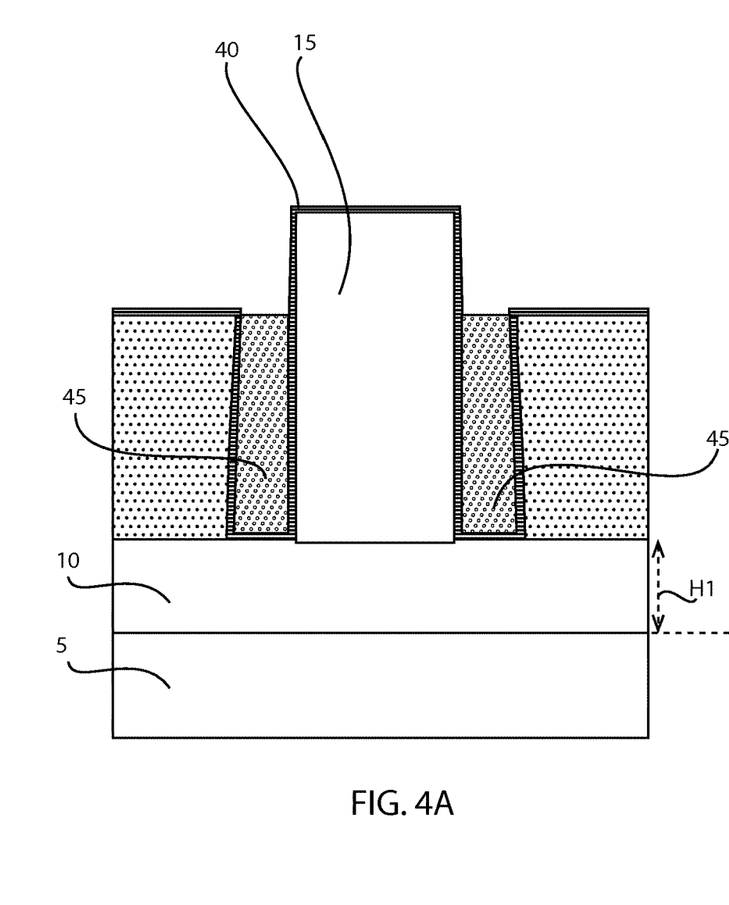
FIG. 4A is a side cross-sectional view along the section line through the fin structure depicting forming a low-k dielectric portion of the composite spacer, in accordance with one embodiment of the present disclosure.
Figure 4B:
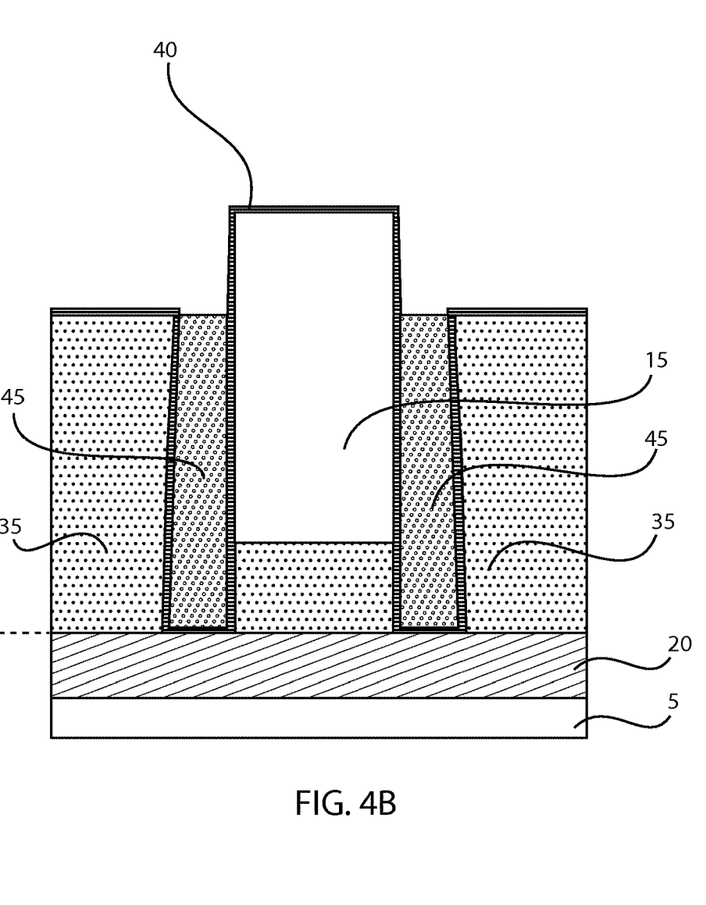
FIG. 4B is a side cross-sectional view along the section line between adjacent fin structures of the structure depicted in FIG. 4A.

FIGS. 4A and 4B depict forming a low-k dielectric portion 45 of the composite spacer. In one embodiment, the low-k material that provides the low-k dielectric portion 45 of the composite spacer may have a dielectric constant ranging from 1.0 to 3.5. In another embodiment, the low-k material that provides the low-k dielectric portion 45 of the composite spacer may have a dielectric constant ranging from 1.75 to 3.2. Examples of materials suitable for the low-k dielectric portion 45 of the composite spacer may include silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric portion 45 of the composite spacer may be deposited using chemical vapor deposition (CVD). Variations of CVD processes suitable for forming the low-k dielectric portion 45 of the composite spacer include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the low-k dielectric portion 45 of the composite spacer may be composed of a low-k dielectric material that can include spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

In some embodiments, the low-k dielectric portion 45 of the composite spacer 45 is deposited within the spacer opening to a thickness that is substantially equal to the height of the upper surface of the epitaxial semiconductor material 35. In some embodiments, the low-k dielectric portion 45 of the composite spacer is deposited to a thickness that overflows the spacer opening. In this example, an etch back process, such as an anisotropic etch, e.g., RIE, or an isotropic etch, such as a wet chemical etch, etches the material for the deposited low-k dielectric portion 45 of the composite spacer back to be substantially coplanar with the upper surface of the epitaxial semiconductor material 35, as depicted in FIGS. 4A and 4B.

Figure 5A:
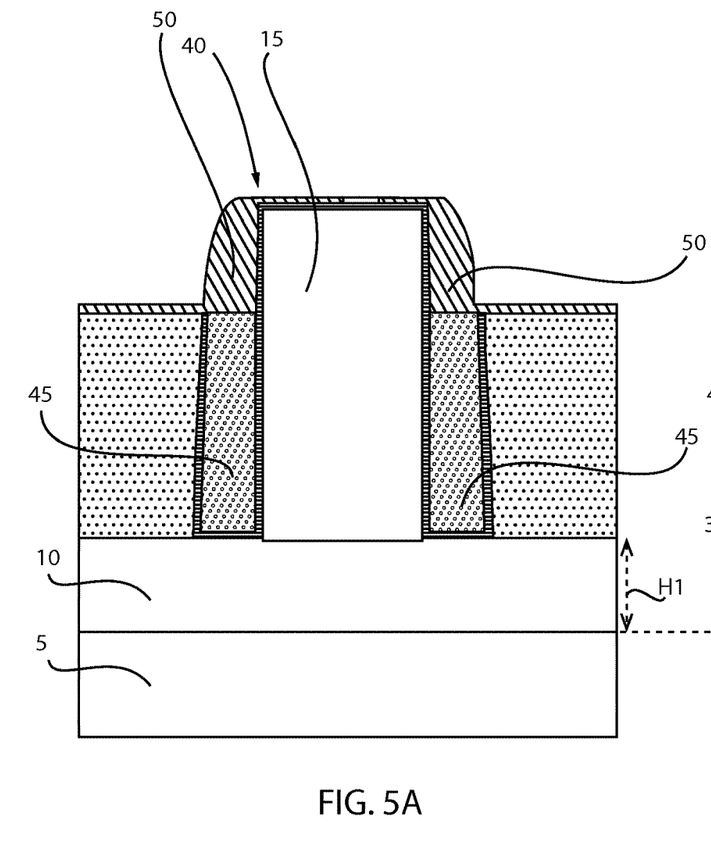
FIG. 5A is a side cross-sectional view along the section line through the fin structure depicting forming a high-k dielectric portion of the composite spacer, in accordance with one embodiment of the present disclosure.
Figure 5B:
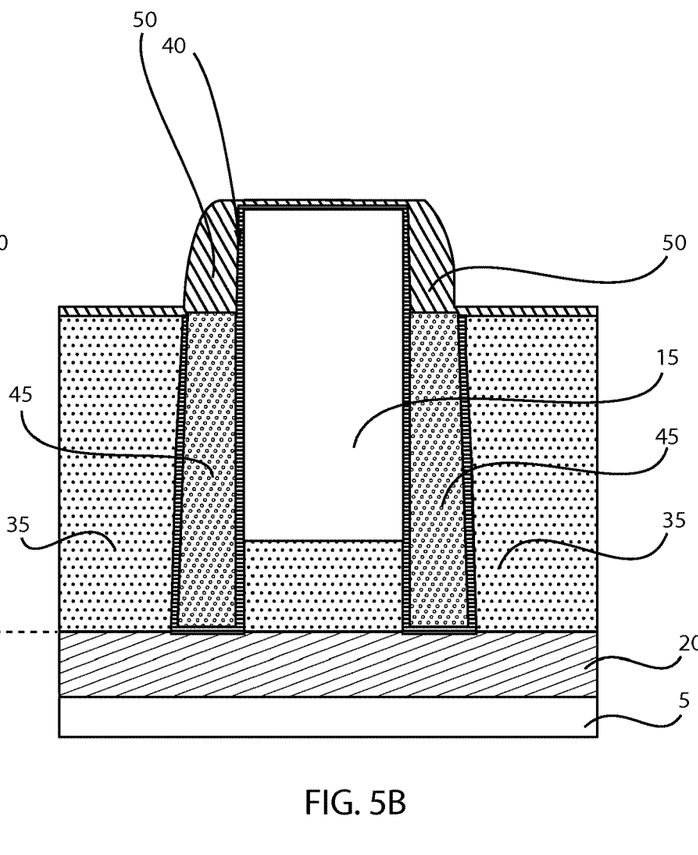
FIG. 5B is a side cross-sectional view along the section line between adjacent fin structures of the structure depicted in FIG. 5A.

FIGS. 5A and 5B depict forming a high-k dielectric portion 50 of the composite spacer atop the low-k dielectric portion 45 of the composite spacer. The term high-k denotes that the dielectric constant of the high-k dielectric portion 50 of the composite spacer is greater than the dielectric constant of silicon oxide at room temperature, e.g., 20° C. to 25° C. In some embodiments, the high-k dielectric portion 50 of the composite spacer has a dielectric constant of 4.0 or higher. In another example, the high-k dielectric portion 50 of the composite spacer has a dielectric constant greater than 7.0. In one embodiment, the high-k dielectric portion 50 of the composite spacer his composed of a nitride, such as silicon nitride, e.g., $Si_3N_4$. Boron nitride may also be a suitable material for the high-k dielectric portion 50 of the composite spacer. In other embodiments, the high-k dielectric portion 50 of the composite spacer is a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. The high-k dielectric portion 50 of the composite spacer may also be selected from hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate ($ZrSiO_x$) and combinations thereof, so long as the material combinations selected provide for etch selectivity in accordance with the following described process flow.

In some embodiments, the high-k dielectric portion 50 of the composite spacer can be formed by a conformal deposition of a dielectric material layer on at least the upper sidewalls of the replacement gate conductor 15, but is typically also deposited on the upper surface of the replacement gate conductor 15 and the upper surface of the epitaxial semiconductor material 35. The deposition process used for forming the dielectric material layer for the material for the high-k dielectric portion 50 may be chemical vapor deposition (CVD), such as plasma enhanced chemical vapor deposition (PECVD) or metal organic chemical vapor deposition (MOCVD). An anisotropic etch, e.g., reactive ion etch (RIE), may then remove the portions of the dielectric material for the high-k dielectric portion 50 of the composite spacer that is present on the epitaxial semiconductor material 35, as well as removing at least a majority of the high-k dielectric material that is present on the upper surface of the replacement gate conductor 15. The remaining portion of the high-k dielectric material that is present on the sidewalls of the replacement gate conductor 15 provides the high-k dielectric portion 50 of the composite spacer. In some embodiments, a thin layer of high-k dielectric material may remain on the upper surface of the replacement gate conductor 15, as depicted in FIGS. 5A and 5B.

Figure 6A:
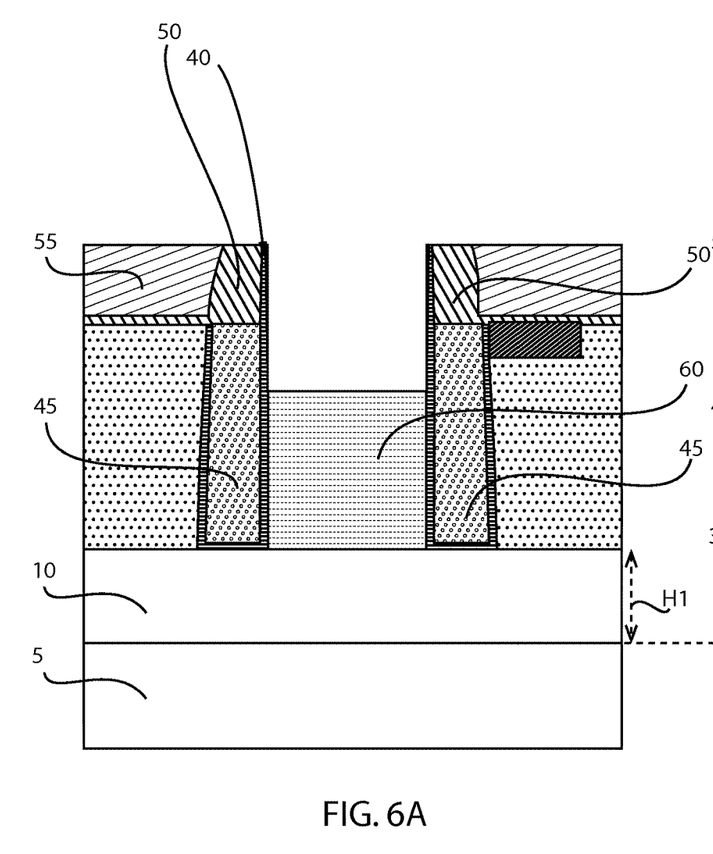
FIG. 6A is a side cross-sectional view along the section line through the fin structure depicting removing the replacement gate structure, and forming a functional gate structure, in accordance with one embodiment of the present disclosure.
Figure 6B:
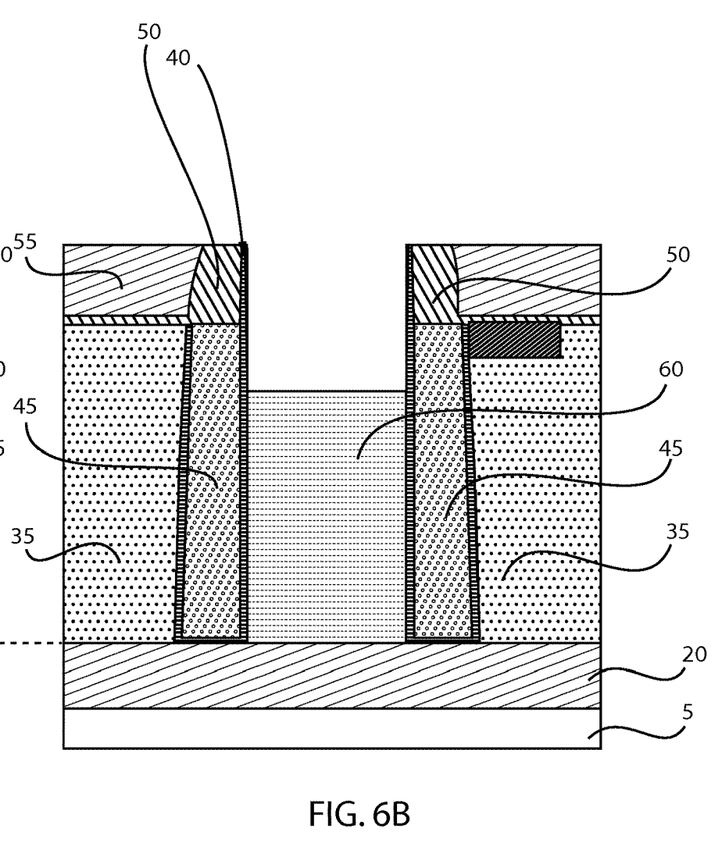
FIG. 6B is a side cross-sectional view along the section line between adjacent fin structures of the structure depicted in FIG. 6A.

FIGS. 6A and 6B depict removing the replacement gate conductor 15 to form a gate opening, and forming a functional gate structure 60 in the gate opening. In some embodiments, removing the replacement gate conductor 15 may begin with forming an interlevel dielectric layer 55 on an upper surface of the epitaxial semiconductor material 45 of the source and drain regions, and planarizing the interlevel dielectric layer 55 until contacting the upper surface of the replacement gate conductor 15 so that an upper surface of the replacement gate structure 15 and an upper surface of the interlevel dielectric layer 55 are coplanar. The interlevel dielectric layer 55 may be composed of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). It is noted that the above compositions for the interlevel dielectric layer 55 are provided for illustrative purposes only, and are not intended to limit the present disclosure, as any dielectric material is suitable for the interlevel dielectric layer 55, so long as the replacement gate conductor 15 may be removed selectively to the interlevel dielectric layer 55. The interlevel dielectric layer 55 may be deposited using a deposition process, such as chemical vapor deposition (CVD), plasma enhanced chemical vapor deposition (PECVD), physical vapor deposition (PVD), spin on deposition and other like deposition processes. The interlevel dielectric layer 55 may be planarized using chemical mechanical planarization (CMP).

The replacement gate conductor 15 may then be removed using an etch process that is selective to at least the interlevel dielectric layer 55, and the etch barrier layer 45. The etch barrier layer 45 protects the composite spacer including the low-k dielectric portion 45 and the high-k dielectric portion 50 from being damaged by the etch process for removing the replacement gate conductor 15. The selective etch process may be a wet or dry etch process. In one embodiment, the replacement gate structure 15 is removed by reactive ion etch (RIE). When composed of polysilicon, the replacement gate structure 15 may be removed using etch chemistries, such as HBr, $SF_6$, and $NH_4OH$.

FIGS. 6A and 6B depicts forming a functional gate structure 60 in the opening formed by removing the replacement gate conductor. The "functional gate structure" operates to switch the semiconductor device from an "on" to "off" state, and vice versa. The functional gate structure 60 typically includes at least on gate dielectric and at least one gate conductor. In one embodiment, the at least one gate dielectric includes, but is not limited to, an oxide, nitride, oxynitride and/or silicates including metal silicates, aluminates, titanates and nitrides. In one example, when the at least one gate dielectric is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The conductive material of the gate conductor may comprise polysilicon, SiGe, a silicide, a metal or a metal-silicon-nitride such as Ta—Si—N. Examples of metals that can be used as the gate conductor include, but are not limited to, Al, W, Cu, and Ti or other like conductive metals. The layer of conductive material for the gate conductor may be doped or undoped. If doped, an in-situ doping deposition process may be employed. Alternatively, a doped conductive material can be formed by deposition, ion implantation and annealing.

The at least one gate dielectric may be formed using a deposition process, such as chemical vapor deposition (CVD). Examples of CVD processes for forming the at least one gate dielectric include chemical vapor deposition (CVD), plasma enhanced chemical vapor deposition (PECVD), physical vapor deposition (PVD), atomic layer deposition (ALD) and other like deposition processes. The at least one gate dielectric may also include material layers formed using a thermal growth process, such as thermal oxidation. The at least one gate conductor may be formed on the at least one gate dielectric. The at least one gate conductor may be formed using a deposition process. For example, when the at least one gate conductor is composed of a semiconductor material, the at least one gate conductor may be formed using may be formed using a deposition process, such as chemical vapor deposition (CVD). Examples of CVD processes for forming the at least one gate conductor include chemical vapor deposition (CVD), plasma enhanced chemical vapor deposition (PECVD), atomic layer deposition (ALD) and other like deposition processes. In another embodiment, when the at least one gate conductor is composed of a metal, the at least one gate conductor is formed using a physical vapor deposition (PVD) process, such as sputtering. Examples of sputtering apparatus that may be suitable for depositing the at least one gate conductor include DC diode type systems, radio frequency (RF) sputtering, magnetron sputtering, and ionized metal plasma (IMP) sputtering.

Figure 7A:
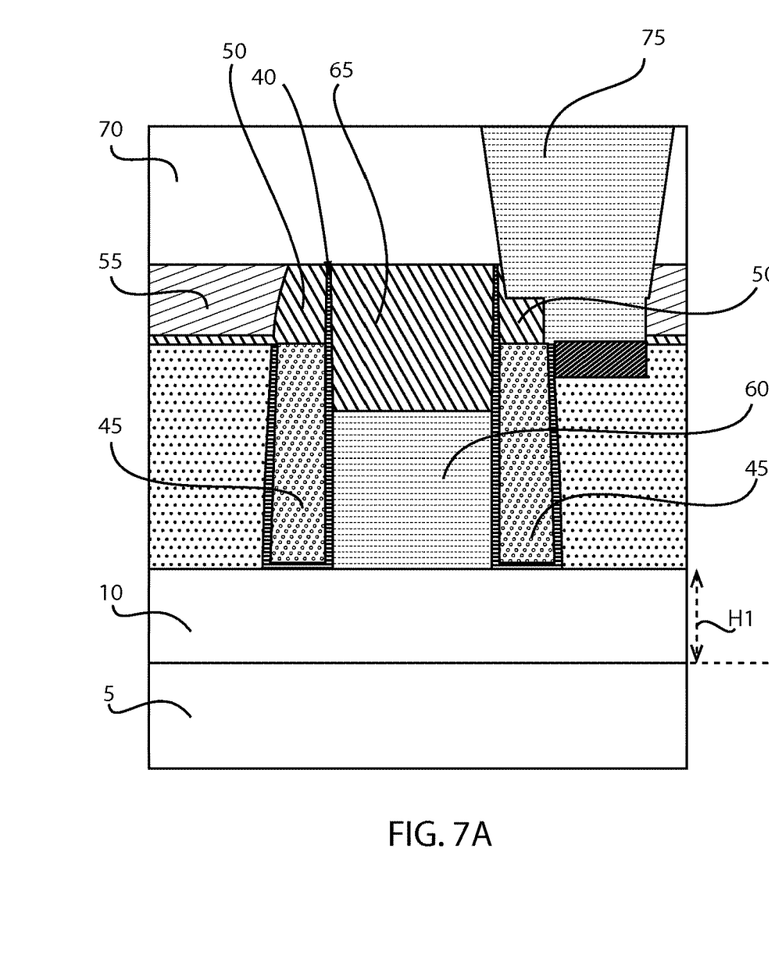
FIG. 7A is a side cross-sectional view along the section line through the fin structure depicting forming a gate dielectric cap, forming an interlevel dielectric layer, forming a via opening, and forming a contact within the via openings, in accordance with one embodiment of the present disclosure.
Figure 7B:
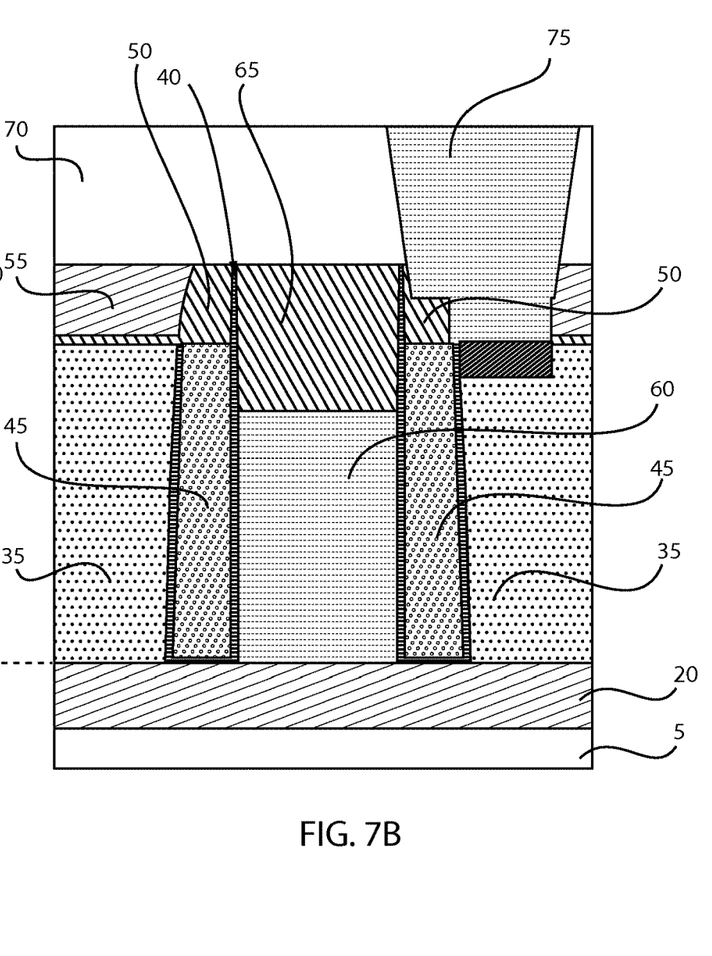
FIG. 7B is a side cross-sectional view along the section line between adjacent fin structures of the structure depicted in FIG. 7A.

FIGS. 7A and 7B depict forming a gate dielectric cap 65, forming a second interlevel dielectric layer 70, forming a via opening, and forming a contact 75 within the via openings. The gate dielectric cap 65 may be formed using a deposition process, such as chemical vapor deposition (CVD). The gate dielectric cap 65 may be composed of an oxide or nitride containing dielectric, such as silicon oxide or silicon nitride.

Following the formation of the gate dielectric cap 65, an additional layer of interlevel dielectric material, i.e., second interlevel dielectric layer 70, may be deposited, and contacts 75 may be formed to the epitaxial semiconductor material 35 on the source region and the drain region portions of the fin structures. To form the contacts 75, the additional layer of the interlevel dielectric material may be patterned and etched to form via holes to the various source/drain and gate conductor regions of the device.

In some embodiments, the via openings may be formed using photolithography and etch processes. For example, a photoresist etch mask can be produced by applying a photoresist layer to the upper surface of the second interlevel dielectric layer 70, exposing the photoresist layer to a pattern of radiation, and then developing the pattern into the photoresist layer utilizing a resist developer. The photoresist etch mask may be positioned so that portions of the second interlevel dielectric layer 70 are not protected by the photoresist etch mask in order to provide the openings.

Via openings may then be etched through the second interlevel dielectric layer 70, and the first interlevel dielectric layer 55 to expose a contact portion of the epitaxial semiconductor material 35 on the source and drain region portions of the semiconductor device. The etch process for forming the via openings may be an anisotropic etch process, such as reactive ion etch (RIE). In some embodiments, when there is mask misalignment for forming the via openings, the high-k portion 50 of the composite spacer may protect the low-k portion 45 of the composite spacer from being damaged by the via opening etch.

Following via formation, the contacts 75 are formed by depositing a conductive metal into the via holes using deposition methods, such as CVD or plating. The conductive metal may include, but is not limited to: tungsten, copper, aluminum, silver, gold and alloys thereof.

FIGS. 7A and 7B depict one embodiment of a semiconductor device that includes a fin structure, and a gate structure 60 present on a channel region of the fin structure. A composite spacer 40, 45, 50 is present on a sidewall of the gate structure 60 including an upper portion having a first dielectric constant (high-k dielectric portion 50), a lower portion having a second dielectric constant (low-k dielectric portion 45) that is less than the first dielectric contacts, and an etch barrier layer 45 between sidewalls of the first and second portion of the composite spacer and the gate structure. The etch barrier layer 45 may be comprised of an alloy including at least one of silicon, boron and carbon.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
    forming an epitaxial semiconductor material on upper surfaces of portions of a fin structure on opposing sides of a replacement gate conductor of a replacement gate structure, the replacement gate structure including a replacement sidewall spacer;
    removing the replacement sidewall spacer to provide a spacer opening between the epitaxial semiconductor material and the replacement gate conductor of the replacement gate structure;
    forming an etch barrier layer on exposed sidewalls of the epitaxial semiconductor material and the replacement gate conductor using a single deposition;
    forming a composite spacer in the spacer opening including a first portion having a first dielectric constant on the fin structure and a second portion of a second dielectric constant on the first portion of the composite spacer, the first dielectric constant being less than the second dielectric constant, the etch barrier layer being composed of a single material layer provided by the single deposition, the single material layer of the etch barrier layer having a U-shaped geometry having an outside composite spacer sidewall portion having an upper surface coplanar with a base surface of the second portion of the composite spacer, and the etch barrier layer having an inner composite spacer sidewall portion having an upper surface that is coplanar with an upper surface of the second portion of the composite spacer, wherein the inner composite spacer sidewall portion of the etch barrier comprises a lower portion entirely in contact with the first portion of the composite spacer, and an upper portion entirely in contact with the second portion of the composite spacer; and
    replacing the replacement gate conductor with a functional gate conductor, wherein an entirety of the functional gate conductor sidewall is in contact with the lower portion of the inner composite spacer sidewall portion of the etch barrier layer.

2. The method of claim 1, wherein said replacing the replacement gate conductor structure with the functional gate conductor comprises:
- removing the replacement gate conductor with an etch to provide a gate conductor opening, wherein the etch barrier layer protects the composite spacer during said etch; and
- forming the functional gate conductor in the gate conductor opening.

3. The method of claim 1, wherein the etch barrier layer is a conformally deposited layer.

4. The method of claim 3, wherein the etch barrier layer comprises at least one of silicon, boron, carbon and nitrogen.

5. The method of claim 1, wherein the first portion of the composite spacer having the first dielectric constant comprises silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) or combinations thereof.

6. The method of claim 1, wherein the second portion of the composite spacer comprises silicon nitride, boron nitride, $HfO_2$, $ZrO_2$, $Al_2O_3$, $TiO_2$, $La_2O_3$, $SrTiO_3$, $LaAlO_3$, $Y_2O_3$, hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate (ZrSiOx) or combinations thereof.

7. A method of forming a semiconductor device comprising:
- forming an epitaxial semiconductor material on upper surfaces of portions of a fin structure on opposing sides of a replacement gate structure, the replacement gate structure including a replacement gate conductor and a replacement sidewall spacer;
- removing the replacement sidewall spacer to provide a spacer opening between the epitaxial semiconductor material and the replacement gate conductor of the replacement gate structure, wherein an etch barrier layer is present on exposed sidewalls of the epitaxial semiconductor material and the gate structure, the etch barrier layer formed by a single deposition step;
- forming a composite spacer in the spacer opening including a first portion having a first dielectric constant on the fin structure and a second portion of a second dielectric constant on the first portion of the composite spacer, the first dielectric constant being less than the second dielectric constant, the etch barrier layer being composed of a single material layer provided by a single deposition in the spacer opening, the single material layer of the etch barrier layer having a U-shaped geometry having an outside composite spacer sidewall portion having an upper surface coplanar with a base surface of the second portion of the composite spacer, and the etch barrier layer having an inner composite spacer sidewall portion having an upper surface that is coplanar with an upper surface of the second portion of the composite spacer, wherein the inner composite spacer sidewall portion of the etch barrier comprises a lower portion entirely in contact with the first portion of the composite spacer, and an upper portion entirely in contact with the second portion of the composite spacer;
- replacing the replacement gate conductor with a functional gate conductor, wherein an entirety of the functional gate conductor sidewall is in contact with the lower portion of the inner composite spacer sidewall portion of the etch barrier layer; and
- forming contacts to source and drain regions of the fin structure, wherein the second portion of the composite spacer protects the first portion of the composite spacer during via opening etch.

8. The method of claim 7, wherein the etch barrier layer is a conformally deposited layer.

9. The method of claim 8, wherein the etch barrier layer comprises at least one of silicon, boron, carbon and nitrogen.

10. The method of claim 7, wherein the first portion of the composite spacer having the first dielectric constant comprises silicon carbon boron nitride (SiCBN), silicon oxycarbonitride (SiOCN), fluorine doped silicon dioxide, carbon doped silicon dioxide, porous silicon dioxide, porous carbon doped silicon dioxide, organosilicate glass (OSG), diamond-like carbon (DLC) or combinations thereof.

11. The method of claim 7, wherein the second portion of the composite spacer comprises silicon nitride, boron nitride, $HfO_2$, $ZrO_2$, $Al_2O_3$, $TiO_2$, $La_2O_3$, $SrTiO_3$, $LaAlO_3$, $Y_2O_3$, hafnium silicon oxide, hafnium silicon oxynitride, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), zirconium silicate ($ZrSiO_x$) or combinations thereof.

12. The method of claim 7, wherein said forming contacts to the source and drain regions of the fin structure comprises:
- depositing at least one interlevel dielectric layer over the gate structure and the epitaxial semiconductor material;
- forming an etch mask on the at least one interlevel dielectric layer;
- etching the at least one interlevel dielectric layer to form via openings with an anisotropic etch; and
- depositing conductive material in the via openings.

* * * * *